United States Patent
Koh et al.

(10) Patent No.: US 7,842,451 B2
(45) Date of Patent: Nov. 30, 2010

(54) METHOD OF FORMING PATTERN

(75) Inventors: Cha-Won Koh, Yongin-si (KR); Sang-Gyun Woo, Yonging-si (KR); Gi-Sung Yeo, Seoul (KR); Myoung-Ho Jung, Yonging-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/511,538

(22) Filed: Jul. 29, 2009

(65) Prior Publication Data

US 2009/0291561 A1 Nov. 26, 2009

Related U.S. Application Data

(63) Continuation of application No. 11/145,535, filed on Jun. 3, 2005, now Pat. No. 7,575,855.

(30) Foreign Application Priority Data

Jun. 7, 2004 (KR) .............................. 2004-41436

(51) Int. Cl.
*G03F 1/00* (2006.01)
*G03F 7/00* (2006.01)

(52) U.S. Cl. .................. 430/323; 430/322; 430/324; 430/270.1; 216/58; 216/67

(58) Field of Classification Search ............... 430/270.1, 430/322, 323, 324; 216/58, 67
See application file for complete search history.

(56) References Cited

U.S. PATENT DOCUMENTS 5,457,003 A 10/1995 Tanaka et al.

FOREIGN PATENT DOCUMENTS

| JP | 07-104483 | 4/1995 |
| JP | 07-135140 | 5/1995 |
| JP | 2001-267230 | 9/2001 |
| KR | 1020010011765 A | 2/2001 |
| KR | 1020010088831 A | 9/2001 |
| KR | 1020010092385 | 10/2001 |
| KR | 2003-0029804 | 4/2003 |

*Primary Examiner*—Amanda C. Walke
(74) *Attorney, Agent, or Firm*—F. Chau & Associates, LLC

(57) ABSTRACT

Disclosed is a method of forming a pattern. A first organic polymer layer is formed on a substrate on which an underlying layer, and then a second organic polymer layer, which has an opening partially exposing the first organic polymer layer, is formed on the first organic polymer layer. Next, a silicon-containing polymer layer is formed on the second organic polymer layer to cover the opening. The silicon-containing polymer layer is oxidized and simultaneously the second organic polymer layer and the first organic polymer layer are ashed by oxygen plasma to form a pattern having an anisotropy-shape. The underlying layer is etched using the silicon-containing polymer layer and the first organic polymer layer as an etching mask to form a pattern.

19 Claims, 7 Drawing Sheets

METHOD OF FORMING PATTERN

CROSS-REFERENCE TO RELATED APPLICATIONS

This is a continuation of U.S. application Ser. No. 11/145,535 filed on Jun. 3, 2005, now U.S. Pat. No. 7,575,855 which claims priority under 35 U.S.C. §119 to Korean Patent Application No. 2004-41436 filed on Jun. 7, 2004, contents of both are hereby incorporated by reference in their entirety.

BACKGROUND OF THE INVENTION

The present invention relates to a method of forming a pattern. More particularly, the present invention relates to a method of forming a pattern using a photosensitive organic polymer.

As the degree of integration for semiconductor devices become higher, the critical dimension (CD) of the pattern formed on a substrate decreases, and at the same time requiring more complex pattern structure. At present, it is difficult to form a photoresist pattern having narrow critical dimension and a dense structure using conventional photolithography techniques.

The art has proposed various methods of forming the photoresist pattern having a desired design. In particular, methods of forming the photoresist pattern using a non-photosensitive organic layer are disclosed in Korean Patent No. 10-396,193 and U.S. Pat. No. 6,670,106 as examples.

FIGS. 1A through 1C are views illustrating processing steps of forming the pattern disclosed in the above-mentioned patents.

Referring to FIG. 1A, a positive photoresist layer is coated on an underlying layer 21 formed on a substrate (not shown), and then a photoresist pattern 22 is exposed and developed to form an opening 25 that exposes the underlying layer 21.

Referring to FIG. 1B, a non-photosensitive organic layer 26 is formed on the photoresist pattern 22 so as to fill the opening 25, and then the non-photosensitive organic layer 26 is etched back using oxygen plasma until a top surface of the photoresist pattern 22 is exposed. Here, the opening 25 has a high step-difference with respect to the photoresist pattern 22 of more than 0.9 μm so that the non-photosensitive organic layer 26 is only slightly formed on the top surface of the photoresist pattern 22 when the non-photosensitive organic layer 26 fills the opening 25. 0.9 μm so that the non-photosensitive organic layer 26 is only slightly formed on the top surface of the photoresist pattern 22 when the non-photosensitive organic layer 26 fills the opening 25.

Referring to FIG. 1C, an entire surface of a resultant structure having the non-photosensitive organic layer 26 and the photoresist pattern 22 is exposed by light such as ultraviolet or X-ray, etc., and then the resultant structure is developed with an alkali-solution to remove the photoresist pattern 22. As a result, the non-photosensitive organic pattern 26a is formed on the underlying layer 21.

According to previously issued patents, if a pattern is formed as the non-photosensitive organic pattern 26a, the pattern may be straight (vertical type). On the other hand, if a pattern such as a photosensitive organic pattern is formed by the positive photoresist layer, the pattern may slope due to diffraction light.

However, as shown in FIG. 2A, when the photoresist pattern 22a having the opening 25a is formed on the underlying layer 21, there is a problem that the width of the opening 25a may decrease as the opening 25a approaches a lower portion of the photoresist pattern 22a. Thus, as shown in FIG. 2B, a contact area 30 between the non-photosensitive organic pattern 26a and the underlying layer 21a is reduced, so that the non-photosensitive organic pattern 26a leans or is separated from the underlying layer 21a during removal of the photoresist pattern 22a with the alkali-solution. These problems occur to such an extent that the critical dimension of the non-photosensitive organic pattern 26a is reduced. In particular, when a film is exposed to light having a short wavelength and high resolution to form a fine pattern, the shorter the wavelength is in the exposure process, the more an allowable limit of a DOF (depth of focus) of the light is reduced. Therefore, if the light of the short wavelength is used in the exposure process, the width of the opening 25a will become incrementally narrower, so that the defocus margin with respect to the DOF is decreased.

It is desirable to form a thin photoresist layer in order to improve the defocus margin. However, the thickness of the non-photosensitive organic pattern 26a is proportional to the thickness of a photoresist layer for forming the photoresist pattern 22a. As a result, while the underlying Layer 21a is etched, a lower portion of the underlying layer 21a is also etched because the non-photosensitive organic pattern 26a is insufficient to serve as an etching mask.

SUMMARY OF THE INVENTION

In one embodiment, the present invention provides a method of forming a pattern with a thin photoresist layer capable of increasing a defocus margin with respect to a Depth Of Focus (DOF) in the exposure process.

In another embodiment, the present invention provides a method of forming a pattern with an etching mask having superior property when an underlying layer is etched.

In another embodiment, the present invention provides a method of forming a pattern capable of etching an underlying layer using a thick etching mask and increasing a defocus margin with respect to a DOF though a thin photoresist layer.

An aspect the present invention is a method of forming a pattern using a dual organic polymer layer which comprises a first organic polymer layer and a second organic polymer layer A first organic polymer layer is formed on the substrate on which an underlying layer is also formed, and then the second organic polymer layer, which has an opening partially exposing the first organic polymer layer, is formed on the first organic polymer layer. Hereto, the second organic polymer layer may comprise a photosensitive organic layer. Next, a silicon-containing polymer layer is formed on the second organic polymer layer to cover the opening. Hereto, the silicon-containing polymer layer may be coated to a thickness that is thinner than the second organic polymer layer, or may be etched back after coating thereof. The silicon-containing polymer layer is oxidized and simultaneously the second organic polymer layer and the first organic polymer layer are ashed by oxygen plasma to form a pattern having an anisotropy-shape. The underlying layer is etched using the silicon-containing polymer layer and the first organic polymer layer as an etching mask to form a pattern

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain the principles of the present invention. In the drawings:

FIG. 3B, FIG. 4B, FIG. 5B, and FIG. 6 through FIG. 8 are cross-sectional views illustrating a method of forming a pattern in accordance with a second embodiment of the present invention.

DETAILED DESCRIPTION OF PREFERRED EMBODIMENTS

Figure 1A:
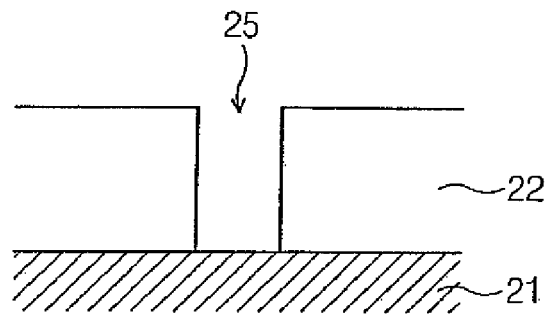
FIG. 1A through 1C are cross-sectional views illustrating a procedure of forming the pattern according to a conventional art.
Figure 1B:
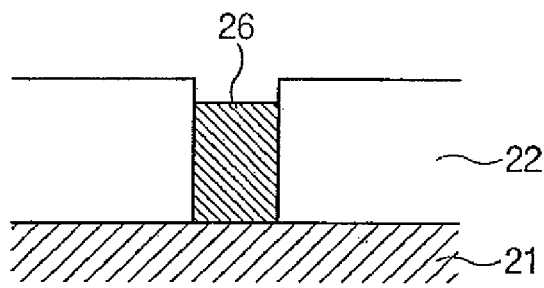
Figure 1C:
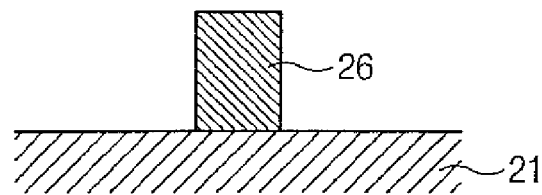
Figure 2A:
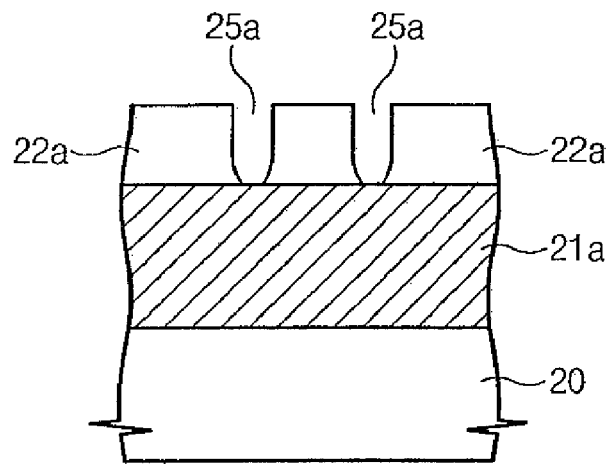
FIGS. 2A and 2B illustrate problems of the procedure of forming the pattern according to a conventional art.
Figure 2B:
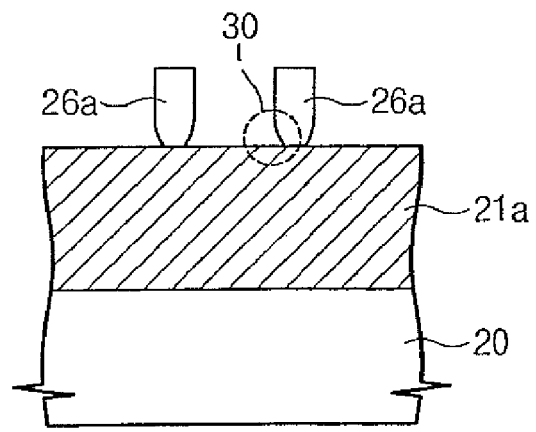

Hereinafter, an exemplary embodiment of the present invention will be described in conjunction with the accompanying drawings. Although the present invention has been described in connection with various embodiments as illustrated in the accompanying drawings, the present invention is not limited thereto. It will be apparent to those skilled in the art that various substitutions, modifications and changes may be made thereto without departing from the scope and spirit of the invention. In the drawings, the thickness of layers and regions are exaggerated for clarity. It will be understood that when an element such as a layer, region or substrate is referred to as being "on" or "onto" another element, it can be directed on the other element or intervening elements may also be present. Like reference numerals refer to similar or identical elements throughout the drawings.

FIG. 3A, FIG. 4A, FIG. 5A, and FIG. 6 through 8 illustrate a method of forming a pattern in accordance with a first embodiment of the present invention.

Figure 3A:
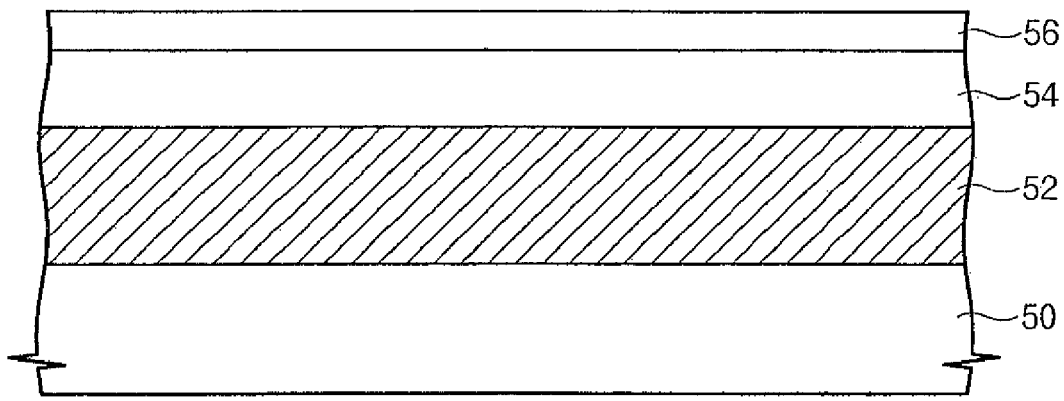
FIG. 3A, FIG. 4A, FIG. 5A, and FIG. 6 through FIG. 8 are cross-sectional views illustrating a method of forming a pattern in accordance with a first embodiment of the present invention.

Referring to FIG. 3A, an underlying layer 52 is formed on a substrate 50, and then a first organic polymer layer 54 and a second organic polymer layer 56 are sequentially formed on the underlying layer 52. The first organic polymer layer 54 serves as an anti-reflection coating layer and an etching mask, and may be formed to have a variable thickness in view of the thickness and the material of the underlying layer 52. The first organic polymer layer 54 may be thicker than the second organic polymer layer 56 so as to serve as a superior etching mask during etching the underlying layer 52. The present invention has features that a defocus margin with respect to the DOF is constantly maintained regardless of the thickness of the etching mask. Therefore, the photoresist layer (first photoresist layer) having a thickness of from about 0.5 µm to about 3 µm may serve as the first organic polymer layer 54.

A photosensitive organic layer may serve as the second organic polymer layer 56. It is preferable that the second organic polymer layer 56 transfer an image of a reticle that is relatively thinly formed so as to improve the defocus margin. For example, a thin photoresist layer (second photoresist layer) having a thickness from about 0.1 µm to about 0.5 µm may serve as the second organic polymer layer 56. The thickness of the second organic polymer layer 56 may be changed in view of the wavelength of the light in the exposure process.

Figure 4A:
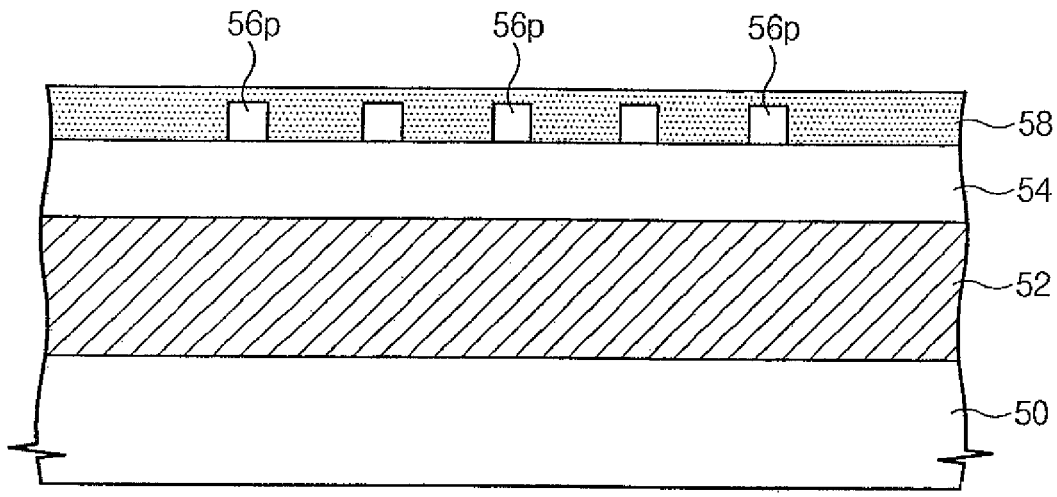

Referring to FIG. 4A, the second organic polymer pattern 56p having opening that partially exposes the first organic polymer layer 54 is formed through patterning the second organic polymer layer 56. The patterning for the second organic polymer layer 56 may be accomplished by a photolithography process.

For instance, an ArF-photoresist layer of 0.2 µm as the second organic polymer layer 56 is coated, and then a soft bake process is performed for 90 seconds at a temperature of 90° C. Next, the photoresist layer is exposed by a light having 193 nm of wavelength, a PEB (post exposure bake) process is performed for 90 seconds at a temperature of 90° C., and then a development process is performed for 60 seconds using a 2.38% of TMAH. As a result, the second organic polymer pattern 56p is formed on the first organic polymer layer 54.

Continuing in FIG. 4A, a silicon-containing polymer layer 58 is successively formed to cover the second organic polymer layer. The silicon-containing polymer layer 58 is uniformly deposited so as to cover the second organic polymer pattern 56p. The silicon-containing polymer layer 58 has at least one constitutional repeating unit (CRU), including a reactive group having silicon as described in the following Chemical formulas 1 and 2.

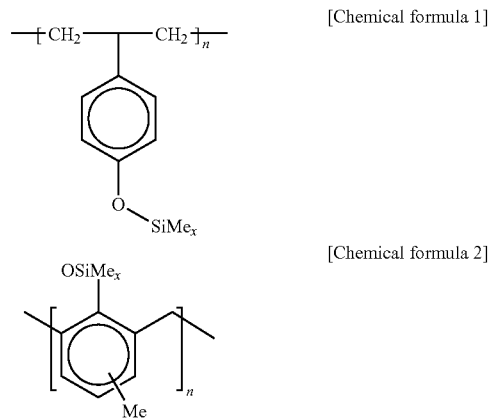

The symbol Me in the Chemical formulas 1 and 2 designates methyl group. Although the above description discloses methyl group as the reaction group of the silicon-containing polymer layer, the reaction group could also be hydrogen, alkyl group including other functional group or any other group known to one of ordinary skill in the art.

Figure 5A:
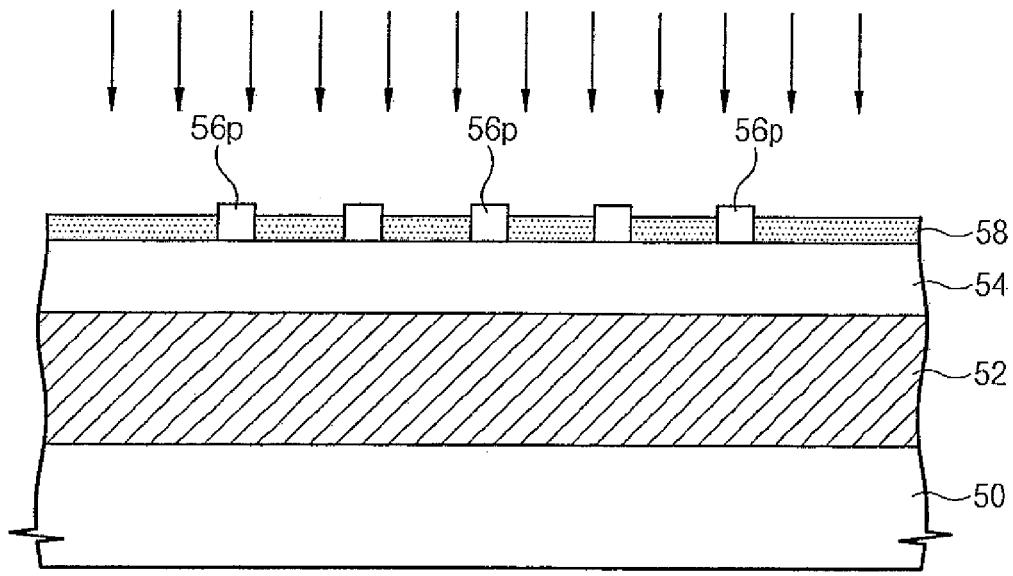

Referring to FIG. 5A, the silicon-containing polymer layer 58 is etched back to expose the second organic polymer pattern 56p. As a result, the silicon-containing polymer layer 58 formed on the second organic polymer pattern 56p is partially removed. As a result, the silicon-containing polymer layer 58 is formed on the opening to expose the first organic polymer layer 54. The silicon-containing polymer layer 58 may be etched back using fluorocarbon-based plasma. In particular, the silicon-containing polymer layer 58 may be subjected to an etch-back process using Ar gas, $CHF_3$ gas, $C_4F_6$ gas and $N_2$ gas that are supplied at a rate of from about 0 to about 200 sccm (standard cubic centimeter per minute), respectively, with base-gas of $CF_4$ gas that is exemplarily supplied at a rate of from about 5 sccm to about 800 sccm.

Figure 6:
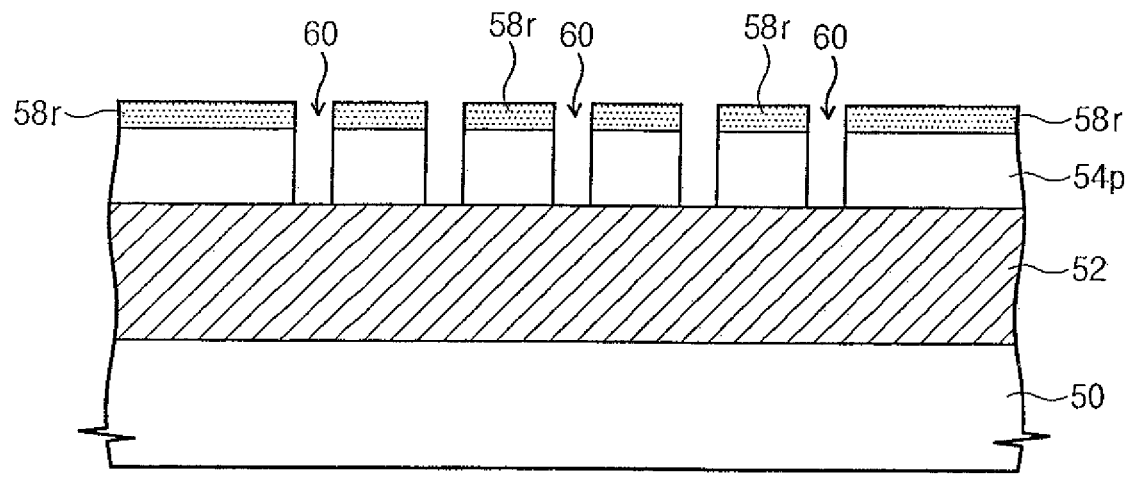

Referring to FIG. 6, the second organic polymer pattern 56p and the first organic polymer layer 54 are anisotropically ashed away using oxygen plasma generated by oxygen gas to form a pattern having an anisotropic shape. At this time, the silicon-containing polymer layer 58 is hardened to an oxide glass by combining silicon atoms and oxygen ions generated from the oxygen plasma. Accordingly, the silicon-containing polymer layer 58 (the oxide glass 58r) functions as an ashing mask in the anisotropy ashing process using the oxygen plasma. And, the second organic polymer layer 56p and the first organic polymer layer 54 formed thereunder are sequentially removed by the anisotropy ashing process, so that opening 60 (first opening) is obtained to partially expose the underlying layer 52. That is, a first organic polymer layer 54$p$ having the opening 60 is formed on the underlying layer 52. Also, inert plasma generated using inert gas or nitrogen plasma generated using nitrogen gas is additionally supplied thereto during the anisotropy ashing process. In particular, the second organic polymer layer 56$p$ and the first organic polymer layer 54 formed thereunder may be ashed away in the anisotropy ashing process by using Ar gas, $N_2$ gas and HBr gas that are exemplarily supplied at a rate from about 0 to about 500 ml/min, respectively, with $O_2$ as a base gas that is exemplarily supplied at a rate of from about 1 mL/min to about 100 mL/min.

Figure 7:
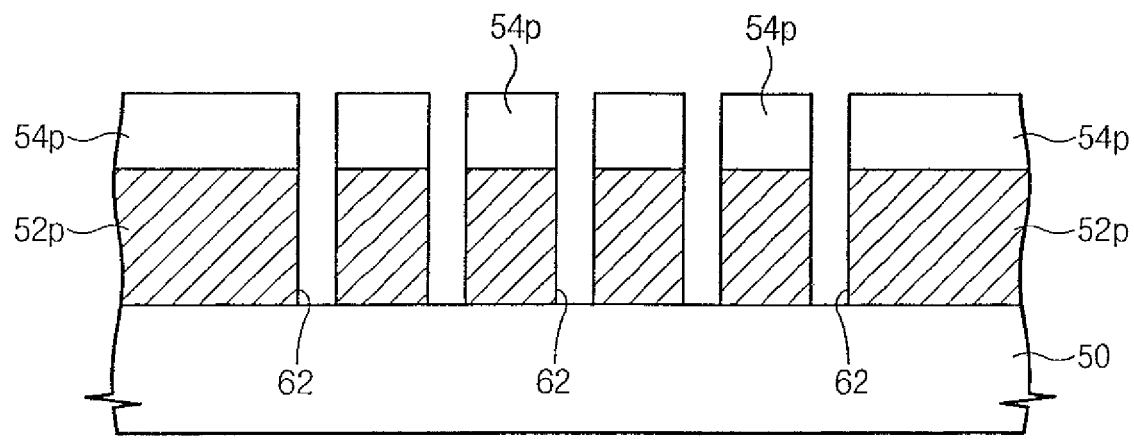

Referring to FIG. 7, an underlying pattern 52$p$ having an opening 62 (second opening) that exposes the substrate 50 is formed by etching the exposed underlying layer 52 using the second organic polymer layer 56$p$ and the first organic polymer layer 54$p$ as an etching mask. During this process, if the underlying layer 52 is made of a silicon oxide layer, the oxide glass 58$r$ is etched together with the exposed underlying layer 52. In addition, since the first organic polymer layer 54$p$ may be thicker than the second organic polymer layer 56$p$, the first organic polymer layer 54$p$ serves as a superior etching barrier (etching mask) while etching the exposed underlying layer 52.

Figure 8:
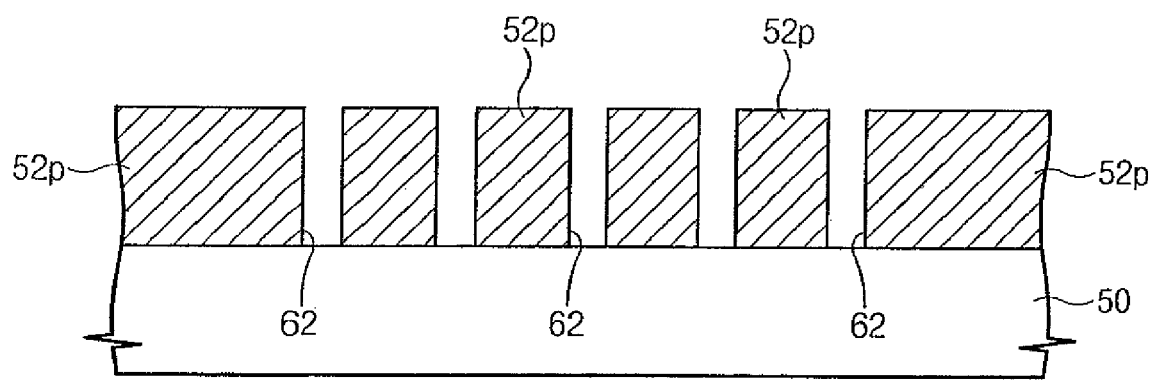

Referring to FIG. 8, the first organic polymer layer 54$p$ is removed. The first organic polymer layer 54$p$ may be removed by a wet etching process using the common photoresist strip solution (stripper) as an alkali-solution. Even if the silicon-containing polymer layer 58 has not been completely removed yet, the polymer layer on the underlying pattern 52$p$ is entirely removed by wet-etching the first organic polymer layer 54$p$.

Figure 3B:
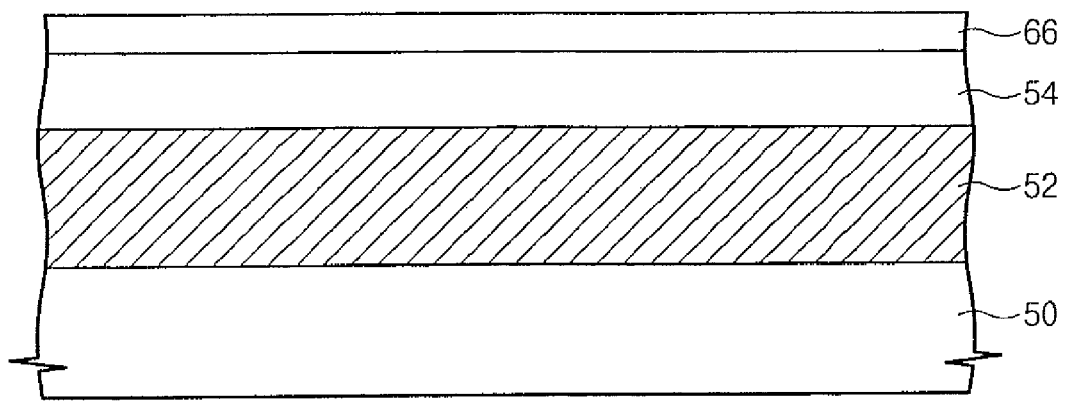
Figure 4B:
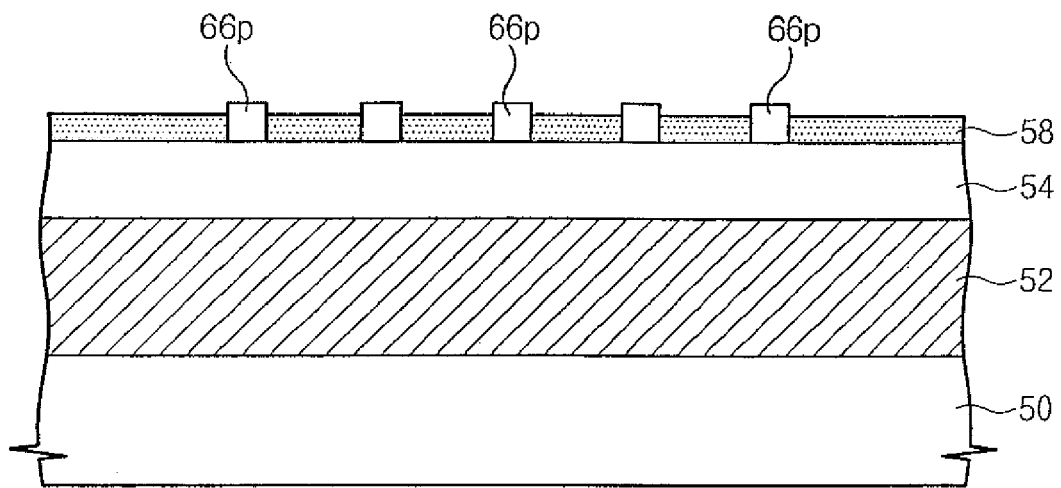
Figure 5B:
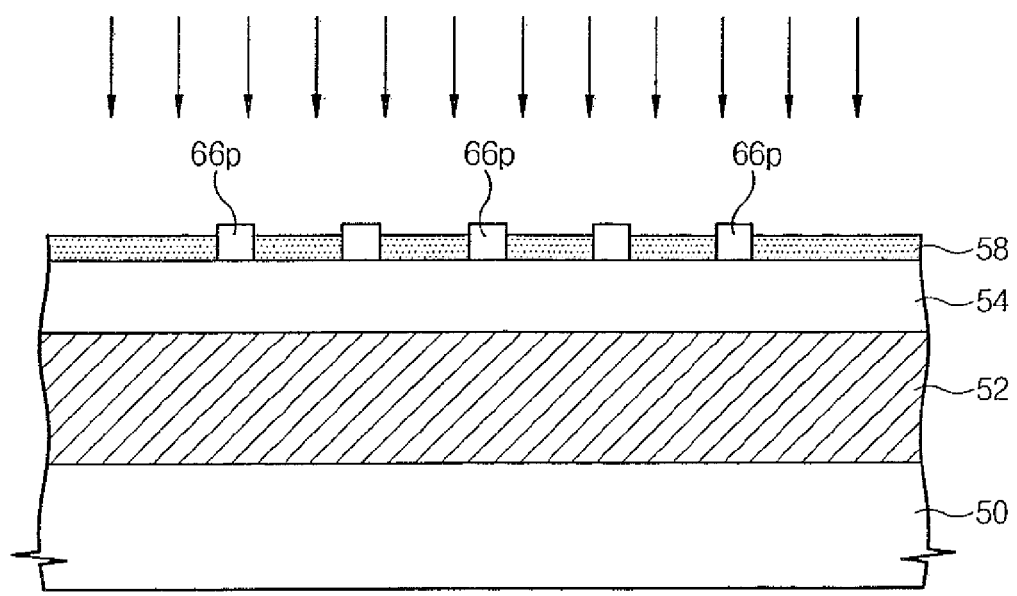

FIG. 3B, FIG. 4B, FIG. 5B. and FIGS. 6 through 8 illustrate a method of forming a pattern in accordance with a second embodiment of the present invention.

Referring to FIG. 3B, an underlying layer 52 is formed on a substrate 50, and then a first organic polymer layer 54 and a second organic polymer layer 56 are sequentially formed on the underlying layer 52. The first organic polymer layer 54 serves as an anti-reflection coating layer and an etching mask, and may be formed to have a variable thickness in view of the thickness and the material of the underlying layer 52. The first organic polymer layer 54 may be thicker than the second organic polymer layer 56 so as to serve as a superior etching mask during etching the underlying layer 52. The present invention has features that a defocus margin with respect to the DOF is constantly maintained regardless of the thickness of the etching mask. Therefore, the photoresist layer (first photoresist layer) having a thickness of from about 0.5 μm to about 3 μm may serve as the first organic polymer layer 54.

A photosensitive organic layer may serve as the second organic polymer layer 66. It is preferable that the second organic polymer layer 56 transfer an image of a reticle that is relatively thinly formed so as to improve the defocus margin. For example, a thin photoresist layer (second photoresist layer) having a thickness from about 0.1 μm to about 0.5 μm may serve as the second organic polymer layer 56. The thickness of the second organic polymer layer 66 may be changed in view of the wavelength of the light in the exposure process.

Referring to FIG. 4B, the second organic polymer pattern 66$p$ having opening that partially exposes the first organic polymer layer 54 is formed through patterning the second organic polymer layer 66. The patterning for the second organic polymer layer 66 may be accomplished by a photolithography process.

For instance, an ArF-photoresist layer of 0.2 μm as the second organic polymer layer 56 is coated, and then a soft bake process is performed for 90 seconds at a temperature of 90° C. Next, the photoresist layer is exposed by a light having 193 nm of wavelength, a PEB (post exposure bake) process is performed for 90 seconds at a temperature of 90° C., and then a development process is performed for 60 seconds using a 2.38% of TMAH. As a result, the second organic polymer pattern 66$p$ is formed on the first organic polymer layer 54.

Continuing in FIG. 4B, a silicon-containing polymer layer 58 is successively formed to cover the second organic polymer layer. The silicon-containing polymer layer 58 is deposited so as to fill the opening by ⅔, not covering the second organic polymer pattern 66$p$. The silicon-containing polymer layer 58 has at least one CRU, including a reactive group having silicon as described in the following Chemical formulas 3 and 4.

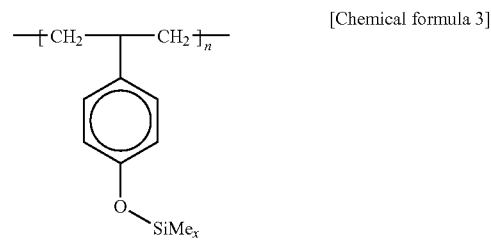

[Chemical formula 3]

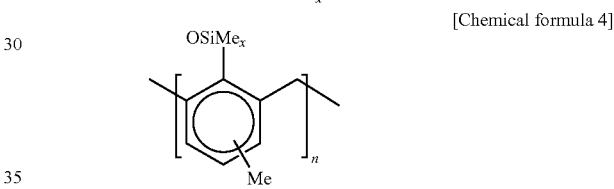

[Chemical formula 4]

The symbol Me in the Chemical formulas 1 and 2 designates methyl group. Although the above description discloses methyl group as the reaction group of the silicon-containing polymer layer, the reaction group could also be hydrogen, alkyl group including other functional group or any other group known to one of ordinary skill in the art.

Referring to FIG. 5B, the silicon-containing polymer layer 58 is etched back to expose the second organic polymer pattern 66$p$. As a result, the silicon-containing polymer layer 58 formed on the second organic polymer pattern 66$p$ is partially removed. As a result, the silicon-containing polymer layer 58 is formed on the opening to expose the first organic polymer layer 54.

Referring to FIG. 6, the second organic polymer pattern 66$p$ and the first organic polymer layer 54 are anisotropically ashed away using oxygen plasma generated by oxygen gas to form a pattern having an anisotropic shape. At this time, the silicon-containing polymer layer 58 is hardened to an oxide glass by combining with silicon atoms and oxygen ions generated from the oxygen plasma. Accordingly, the silicon-containing polymer layer 58 (the oxide glass 58$r$) functions as an ashing mask in the anisotropy ashing process using the oxygen plasma. And, the second organic polymer layer 66$p$ and the first organic polymer layer 54 formed thereunder are sequentially removed by the anisotropy ashing process, so that opening 60 (first opening) is obtained to partially expose the underlying layer 52. That is, a first organic polymer layer 54$p$ having the opening 60 is formed on the underlying layer 52. Also, inert plasma generated using inert gas or nitrogen plasma generated using nitrogen gas is additionally supplied thereto during the anisotropy ashing process. In particular, the second organic polymer layer 56p and the first organic polymer layer 54 formed thereunder may be ashed away in the anisotropy ashing process by using Ar gas, $N_2$ gas and HBr gas that are exemplarily supplied at a rate from about 0 to about 500 mL/min, respectively, with $O_2$ as a base gas that is exemplarily supplied at a rate of from about 1 mL/min to about 100 mL/min.

Referring to FIG. 7, an underlying pattern 52p having an opening 62 (second opening) that exposes the substrate 50 is formed by etching the exposed underlying layer 52 using the second organic polymer layer 66p and the first organic polymer layer 54p as an etching mask. During this process, if the underlying layer 52 is made of a silicon oxide layer, the oxide glass 58r is etched together with the exposed underlying layer 52. In addition, since the first organic polymer layer 54p may be thicker than the second organic polymer layer 66p, the first organic polymer layer 54p serves as a superior etching barrier (etching mask) while etching the exposed underlying layer 52.

Referring to FIG. 8, the first organic polymer layer 54p is removed. The first organic polymer layer 54p may be removed by a wet etching process using the common photoresist strip solution (stripper) as an alkali-solution. Even if the silicon-containing polymer layer 58 has not been completely removed yet, the polymer layer on the underlying pattern 52p is entirely removed by wet-etching the first organic polymer layer 54p.

As illustrated throughout the first and second embodiments of the present invention, the underlying pattern 52p has a shape that is inversed from the second organic polymer pattern (56p or 66p). In other words, the opening 62 exposing the underlying pattern 52p is formed by transferring the second organic polymer pattern, and the underlying pattern 52p is formed by transferring the opening 60 of the second organic polymer pattern. Therefore, in a manufacturing process where an etching area of the underlying layer is enlarged, an exposed area may be greatly reduced by the method of the present invention.

According to an embodiment of the present invention, a dual organic polymer layer comprising a thick etching mask and a thin image-transferring layer is supplied, so that the defocus margin with respect to the DOF increases and an excellent etching barrier is obtained.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a pattern, the method comprising:
   forming a first organic polymer layer on a substrate on which an underlying layer is formed, the first organic polymer layer serving as an anti-reflection coating layer;
   forming a second photosensitive organic polymer pattern on the first organic polymer layer while exposing a portion of the first organic polymer layer;
   forming a silicon-containing polymer layer on the exposed portion of first organic polymer and at least a portion of the sidewall surface of the second photosensitive organic polymer pattern;
   oxidizing the silicon-containing polymer layer and simultaneously anisotropic-ashing the second photosensitive organic polymer pattern and the first organic polymer layer by an oxygen plasma; and
   etching the underlying layer by using an etching mask of the silicon-containing polymer layer and the first organic polymer layer.

2. The method as set forth in claim 1, wherein the silicon-containing polymer layer is deposited thinner than the second photosensitive organic polymer pattern.

3. The method as set forth in claim 1, wherein forming the silicon-containing polymer layer comprises
   etching back the silicon-containing polymer layer to expose a top portion of the second photosensitive organic polymer pattern.

4. The method as set forth in claim 3, wherein the silicon-containing polymer layer is etched back with fluorocarbon-based plasma.

5. The method as set forth in claim 1, which further comprises supplying inert plasma or nitrogen plasma while ashing the first organic polymer layers and the second photosensitive organic polymer pattern.

6. The method as set forth in claim 1, wherein the second photosensitive organic polymer pattern is thinner than the first organic polymer layer.

7. The method as set forth in claim 1, wherein the silicon-containing polymer layer comprises a compound represented by the following chemical formula:

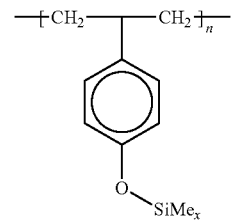

wherein Me represents a methyl radical.

8. The method as set forth in claim 1, wherein the silicon-containing polymer layer comprises a compound represented by the following chemical formula:

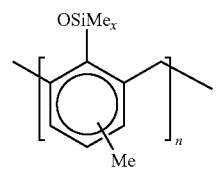

wherein Me represents a methyl radical.

9. A method of forming a pattern, the method comprising:
   sequentially depositing a first organic polymer layer and a second photosensitive organic polymer layers on a substrate on which an underlying layer is formed, the first organic polymer layer serving as an anti-reflection coating layer;
   forming a second photosensitive organic polymer pattern exposing a portion of the first organic polymer layer by patterning the second photosensitive organic polymer layer by means of a photolithography process;
   coating a silicon-containing polymer layer to cover the exposed portion of first organic polymer layer and the second photosensitive organic polymer pattern;
   etching back the silicon-containing polymer layer to cover the exposed portion of first organic polymer layer and at least a portion of the sidewall of the second photosensitive organic polymer pattern;

hardening the silicon-containing polymer layer and simultaneously anisotropic-ashing the second photosensitive organic polymer pattern and the first organic polymer layer by an oxygen plasma; and etching the underlying layer by using an etching mask of the silicon-containing polymer layer and the first organic polymer layer.

10. The method as set forth in claim 9, wherein the first organic polymer layer comprises a non-photosensitive organic polymer layer.

11. The method as set forth in claim 9, wherein the first organic polymer layers comprises a photosensitive organic polymer layer.

12. The method as set forth in claim 9, wherein the silicon-containing polymer layer comprises a compound represented by the following chemical formula:

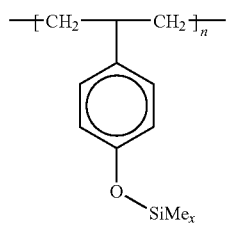

wherein Me represents a methyl radical.

13. The method as set forth in claim 9, wherein the silicon-containing polymer layer comprises a compound represented by the following chemical formula:

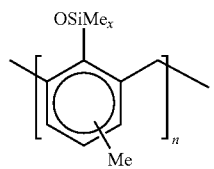

wherein Me represents a methyl radical.

14. The method as set forth in claim 9, wherein the silicon-containing polymer layer is etched back with fluorocarbon-based plasma.

15. The method as set forth in claim 9, wherein inert plasma or nitrogen plasma is additionally supplied while anisotropic-ashing the second photosensitive organic polymer pattern and the first organic polymer layer.

16. The method as set forth in claim 9, wherein the second photosensitive organic polymer layer is formed thinner than the first organic polymer layer.

17. A method of forming a pattern, the method comprising:

sequentially depositing a first organic polymer layer and a second photosensitive organic polymer layer on a substrate on which an underlying layer is formed, the first organic polymer layer serving as an anti-reflection coating layer;

forming a second photosensitive organic polymer pattern exposing a portion of the first organic polymer layer by patterning the second photosensitive organic polymer layer by means of a photolithography process;

depositing a silicon-containing polymer layer that is thinner than the second photosensitive organic polymer pattern to cover the exposed portion of first organic polymer layer and the second photosensitive organic polymer pattern;

etching back the silicon-containing polymer layer to cover the exposed portion of first organic polymer layer and at least a portion of the sidewall of the second photosensitive organic polymer pattern;

hardening the silicon-containing polymer layer and simultaneously anisotropic-ashing the second photosensitive organic polymer pattern and the first organic polymer layer by an oxygen plasma; and etching the underlying layer by using an etching mask of the silicon-containing polymer layer and the first organic polymer layer.

18. The method as set forth in claim 17, wherein the first organic polymer layer comprises a non-photosensitive organic polymer layer.

19. The method as set forth in claim 17, wherein the first organic polymer layer comprises a photosensitive organic polymer layer.

* * * * *